(12) United States Patent
Hirano

(10) Patent No.: US 7,834,978 B2
(45) Date of Patent: Nov. 16, 2010

(54) EXPOSURE APPARATUS, EXPOSURE METHOD, AND DEVICE MANUFACTURING METHOD

(75) Inventor: Tomohiko Hirano, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 464 days.

(21) Appl. No.: 11/447,858

(22) Filed: Jun. 7, 2006

(65) Prior Publication Data
US 2006/0279717 A1  Dec. 14, 2006

(30) Foreign Application Priority Data
Jun. 8, 2005 (JP) ............................. 2005-168407

(51) Int. Cl.
*G03B 27/52* (2006.01)
(52) U.S. Cl. ............................. 355/55; 355/53; 356/401
(58) Field of Classification Search ................... 355/53, 355/55; 356/400, 401; 250/548
See application file for complete search history.

(56) References Cited

U.S. PATENT DOCUMENTS

| 4,962,318 A * | 10/1990 | Nishi | 250/548 |
| 5,243,195 A * | 9/1993 | Nishi | 250/548 |
| 5,801,815 A * | 9/1998 | Takahashi | 355/53 |
| 6,198,527 B1 * | 3/2001 | Nishi | 355/53 |
| 6,539,326 B1 | 3/2003 | Hirano | 702/150 |
| 2002/0006561 A1 * | 1/2002 | Taniguchi | 430/22 |
| 2002/0085184 A1 * | 7/2002 | Amano | 355/30 |
| 2005/0062967 A1 * | 3/2005 | Kobayashi | 356/400 |
| 2006/0279717 A1 | 12/2006 | Hirano | 355/53 |

FOREIGN PATENT DOCUMENTS

JP 62-183515 8/1987

* cited by examiner

*Primary Examiner*—Hung Henry Nguyen
*Assistant Examiner*—Steven H Whitesell-Gordon
(74) *Attorney, Agent, or Firm*—Fitzpatrick, Cella, Harper & Scinto

(57) ABSTRACT

An exposure apparatus for exposing a substrate to light. A substrate stage holds and moves the substrate, a scope measures a predetermined mark to align the substrate, and a controller controls the position of the substrate stage and the operation of the scope, thereby executing a first measurement and a second measurement necessary for a single calibration of the apparatus to align the substrate. The controller executes the first measurement and the second measurement at frequencies different from each other.

5 Claims, 15 Drawing Sheets

EXPOSURE APPARATUS, EXPOSURE METHOD, AND DEVICE MANUFACTURING METHOD

This application claims the benefit of Japanese Patent Application No. 2005-168407, filed on Jun. 8, 2005, which is hereby incorporated by reference herein in its entirety.

FIELD OF THE INVENTION

The present invention relates to an exposure apparatus, an exposure method, and a device manufacturing method.

BACKGROUND OF THE INVENTION

Conventionally, in order to attain precise relative alignment between a reticle and a wafer, the distance (base line amount) between a projection lens and an off-axis observation optical system needs to be precisely calculated.

FIG. 2 is a view schematically showing a method of measuring the base line amount in a projection exposure apparatus. Reference numeral 1 denotes a light source; reference numeral 2, a reticle; and reference numeral 3, a position detection mark arranged on the reticle 2. An illumination optical system 4 uniformly illuminates the reticle 2 with light from the light source 1. A projection lens (projection optical system) 5 projects the pattern of a reticle onto a wafer. Reference numeral 6 denotes a wafer; and reference numeral 7, a wafer chuck to hold the wafer 6. A wafer Z stage 8 can vertically drive the wafer chuck 7. A wafer X-Y stage 9 can hold and drive the wafer Z stage 8 in the X and Y directions, which are parallel to the wafer plane. A wafer stage includes the wafer chuck 7, wafer Z stage 8, and wafer X-Y stage 9. A stage base 10 supports the X-Y stage 9.

A wafer stage position reference mark 11 is positioned to be almost flush with the surface of the wafer 6. A TTL observation optical system 12 detects an image of the wafer stage position reference mark 11, which has returned upon passing through the projection lens 5. Reference numeral 13 denotes a TTL observation optical system arithmetic processor. Reference numeral 14 denotes an off axis observation optical system provided separately from the projection lens 5. Reference numeral 15 denotes an off-axis observation optical system arithmetic processor; and reference numeral 16, a controller to control the overall projection exposure apparatus.

An image of the position detection mark 3 on the reticle 2 is projected onto the wafer stage position reference mark 11 through the projection lens 5. The light reflected by the wafer stage position reference mark 11 is detected by the TTL position observation optical system 12. This makes it possible to calculate the distance from the origin of the wafer stage 8 to the image of the reticle position detection mark 3.

The wafer Z stage 8 is activated to move the wafer stage position reference mark 11 under the off-axis observation optical system 14. The off-axis position observation optical system 14 detects a position detection mark image of the wafer stage position reference mark 11. This makes it possible to calculate the distance from the origin of the wafer stage 8 to the off-axis observation optical system 14.

On the basis of position information of a wafer stage position reference mark 11 measured by the projection lens 5 and that measured by the off-axis observation optical system 14, the distance (base line amount) between the projection lens and the off-axis observation optical system can be calculated.

For alignment precision improvement, it is very important to appropriately control the base line amount in such an exposure apparatus comprising the off-axis observation optical system 14 and TTL observation optical system 12 to control the base line amount, thereby indirectly executing alignment between the reticle and the wafer.

In a best focus position detection method of detecting the position of the image plane of the projection lens 5 using the TTL observation optical system 12, a reference mark on the wafer stage is observed through the projection lens 5, a mark (reticle-side mark) on the reticle or reticle stage and the TTL observation optical system 12. At this time, a focus adjustment process (also to be referred to as reticle-side focus measurement hereinafter) for the TTL observation optical system 12 on the reticle-side mark, and a process (also to be referred to as wafer-side focus measurement hereinafter) of moving the wafer stage in the direction of the optical axis of the projection lens 5 to match the image plane of the reticle-side mark with that of the wafer stage reference mark are executed. To improve the best focus position detection precision, it is very important to appropriately control the precisions of focus measurements on the reticle and wafer sides.

When an exposure process is continuously performed, heat is generated upon driving the reticle and wafer stages and heat due to exposure light irradiation is also generated. A temperature change due to such heat varies the base line and best focus, resulting in deterioration of alignment precision and focus precision. To solve this problem, a method of executing measurement for every wafer exchange or predetermined wafer count is adopted.

As shown in FIG. 15, this measurement method allows base line measurement by causing the off-axis observation optical system 14 and TTL observation optical system 12 to perform measurements at the same base line measurement timing. A measurement timing setting method shown in FIG. 15 will be explained below.

In step 1501, an exposure process is started. The controller 16 determines in step 1502 whether the base line measurement timing is detected. If the base line measurement timing is detected ("YES" in step 1502), the flow advances to step 1503. If no base line measurement timing is detected ("NO" in step 1502), the flow advances to step 1506. In step 1503, the TTL observation optical system 12 performs measurement. In step 1504, the off-axis observation optical system 14 performs measurement. In step 1505, the controller 16 combines the values measured by the observation optical systems to calculate the correction value of a correction item set in a job. The controller 16 controls operation to execute wafer alignment in step 1506 and exposure in step 1507. The controller 16 determines in step 1508 whether exposure for all the shots on the wafer is complete. If exposure for all the shots is complete ("YES" in step 1508), the wafer exposure process is ended. If an unexposed shot remains ("NO" in step 1508), the flow returns to step 1502.

As described above, the conventional measurement method allows the TTL observation optical system 12 and off-axis observation optical system 14 to perform measurements at the same base line measurement timing.

The conventional measurement method executes measurement at a preset design timing regardless of the state of the apparatus.

For example, base line measurement is allowed by causing both the off-axis observation optical system and TTL observation optical system to perform measurements. However, parameters do not necessarily vary so greatly that corrections in both the optical systems are required. A variation on one side may be large and that on the other side may be small.

Similarly, focus measurement systems also suffer from focus variations on the reticle and wafer sides. A variation on one side may be large and that on the other side may be small.

As a result, no measurement timing suitable for each observation optical system is set, so a further improvement in throughput is demanded.

SUMMARY OF THE INVENTION

The present invention has been made in consideration of the above background, and has as its exemplary object to provide a novel technique for performing a process of a single apparatus calibration item including a plurality of measurement items.

According to a first aspect of the present invention, there is provided an exposure apparatus for exposing a substrate to light, the apparatus comprising a substrate stage configured to hold the substrate and to move, a scope configured to measure a predetermined mark to align the substrate, and a controller configured to control a position of the substrate stage and an operation of the scope, and thereby to execute a first measurement and a second measurement necessary for a single calibration item of the apparatus to align the substrate, wherein the controller is configured to execute the first measurement and the second measurement at respective frequencies different from each other.

According to a second aspect of the present invention, there is provided an exposure method of exposing a substrate to light using an exposure apparatus including a substrate stage configured to hold the substrate and to move, and a scope configured to measure a predetermined mark to align the substrate, the method comprising steps of controlling a position of the substrate stage and an operation of the scope, thereby executing a first measurement necessary for a single calibration item of the apparatus to align the substrate, and controlling the position of the substrate stage and the operation of the scope at a frequency different from a frequency of the first measurement, thereby executing a second measurement necessary for the single calibration item.

According to a third aspect of the present invention, there is provided a method of manufacturing a device, comprising steps of exposing a substrate to a pattern using the above exposure apparatus, developing the exposed substrate, and processing the developed substrate to manufacture the device.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

Figure 1:
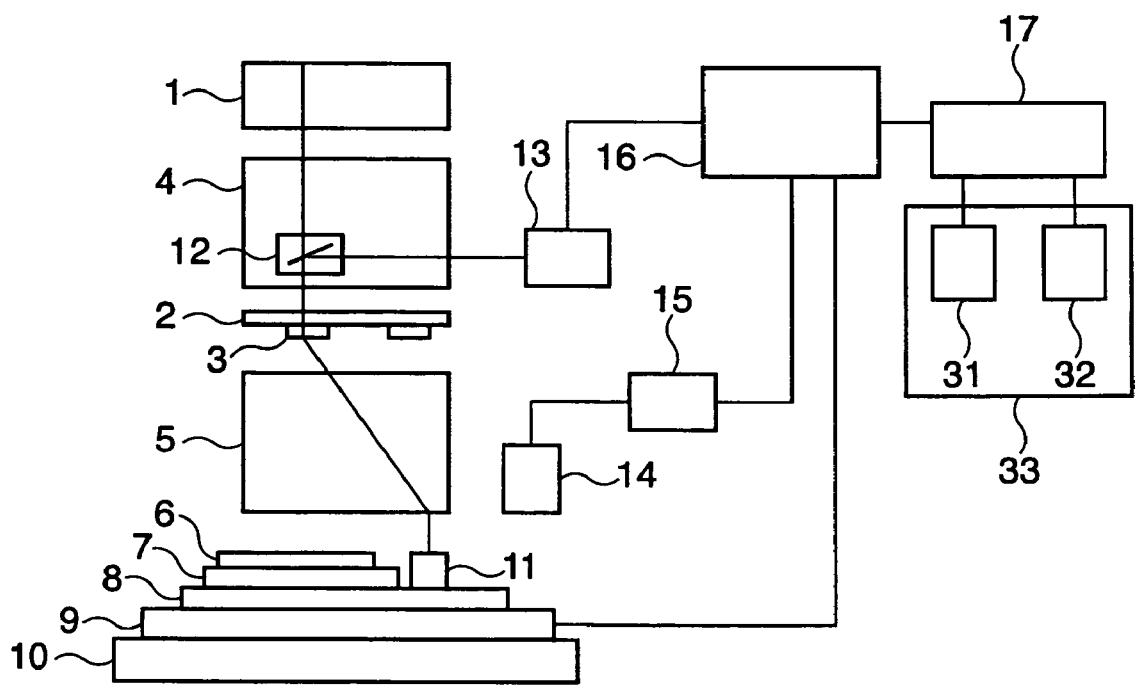
FIG. 1 is a view for schematically explaining a projection exposure apparatus according to a preferred embodiment of the present invention.
Figure 2:
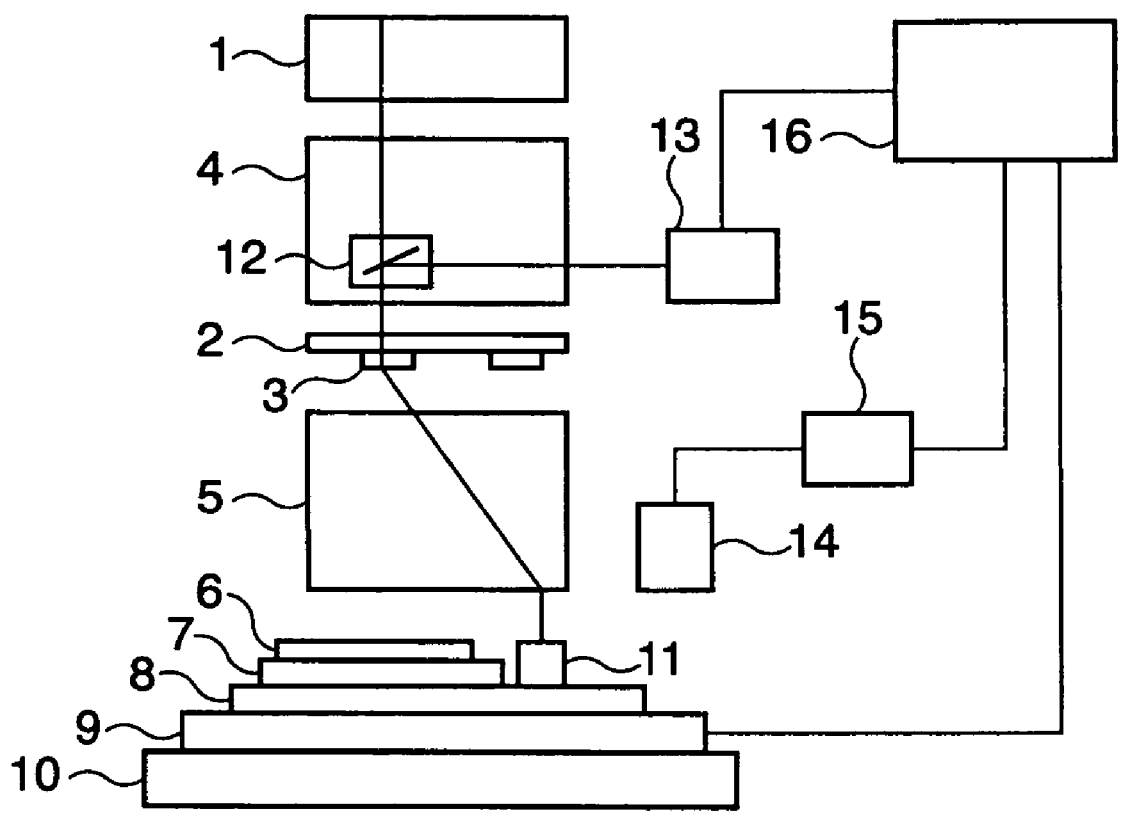
FIG. 2 is a view for schematically explaining the conventional projection exposure apparatus.

A preferred embodiment of the present invention will be described below with reference to the accompanying drawings. FIG. 1 is a schematic view showing a projection exposure apparatus (projection aligner) according to the preferred embodiment of the present invention. Reference numeral 1 denotes a light source; reference numeral 2, a reticle; and reference numeral 3, a position detection mark arranged on the reticle 2. An illumination optical system 4 uniformly illuminates the reticle 2 with light from the light source 1. A projection lens (projection system) 5 projects the pattern of a reticle onto a wafer as an object. Reference numeral 6 denotes a wafer; and reference numeral 7, a wafer chuck to hold the wafer 6. A wafer Z stage 8 can vertically drive the wafer chuck 7. A wafer X-Y stage 9 can hold and drive the wafer Z stage 8 in the X and Y directions that are parallel to the wafer plane. A wafer stage includes the wafer chuck 7, wafer Z stage 8, and wafer X-Y stage 9. A stage base 10 supports the X-Y stage 9.

A wafer stage position reference mark 11 is fixed to the surface of the wafer Z stage 8. A TTL observation optical system 12 detects an image of the wafer stage position reference mark 11, which has returned upon passing through the projection lens 5. Reference numeral 13 denotes a TTL observation optical system arithmetic processor. Reference numeral 14 denotes an off-axis observation optical system provided separately from the projection lens 5. Reference numeral 15 denotes an off axis observation optical system arithmetic processor; and reference numeral 16, a controller to control the overall projection exposure apparatus. Reference numeral 17 denotes a measurement timing arithmetic processor; reference numeral 31, a measurement variation data file; and reference numeral 32, an allowable variation amount setting data file. A storage unit 33 stores the measurement variation data file 31 and allowable variation amount setting data file 32.

A case wherein the projection exposure apparatus according to the preferred embodiment of the present invention is applied to base line measurement will be exemplified.

For base line measurement, the TTL observation optical system 12 and off-axis observation optical system 14 measure the wafer stage position reference mark 11. Conventionally, as shown in FIG. 1, measurements using a plurality of observation optical systems, i.e., the TTL observation optical system 12 and off-axis observation optical system 14 are done at the same measurement timing. In such measurements, rough position detection and precise position detection are executed after reticle-side focus measurement, wafer-side focus measurement, and dimming of a measurement target mark, thus calculating the position misalignment amount (position variation amount). The measurement timing in such measurements is set in a job. Measurement is done at a measurement timing corresponding to every wafer exchange in exposure or a predetermined wafer count.

A measurement timing according to the preferred embodiment of the present invention will be exemplified below. An example of setting of the measurement timings of the observation optical systems will be explained first.

The measurement variation data file 31 to give a measurement timing independently of each observation optical system is created. More specifically, to create the measurement variation data file 31, the exposure conditions (including the exposure amount and scan speed) are changed. An exposure process is performed upon an increase and a decrease in an exposure load, and the observation optical systems execute measurements at the same time. A detected position variation amount b is recorded in association with the elapsed exposure time (wafer count) for each exposure condition to create the measurement variation data file 31. The measurement variation data file 31 makes it possible to calculate a measurement variation in each observation optical system upon an increase and a decrease in an exposure load.

Position measurements are periodically performed for the observation optical systems when the exposure apparatus is inactive (downtime). The position variation amount b as a function of the elapsed time (other than the elapsed exposure time) is recorded in the measurement variation data file 31. Similarly, the position variation amount b as a function of the air pressure variation is recorded in the measurement variation data file 31.

The allowable position variation amount with respect to the values of the measurement variation data file 31 is set for each observation optical system in consideration of the precision standard. Also, a boundary value beyond which the position variation amount b as a function of the elapsed time or air pressure variation exceeds the allowable position variation amount is set as an allowable elapsed time variation or an allowable air pressure variation, and recorded in the allowable variation amount setting data file 32. As described above, creating the data files 31 and 32 containing position variation amounts measured under the respective exposure conditions makes it possible to calculate a measurement timing suitable for each exposure condition.

Figure 13:
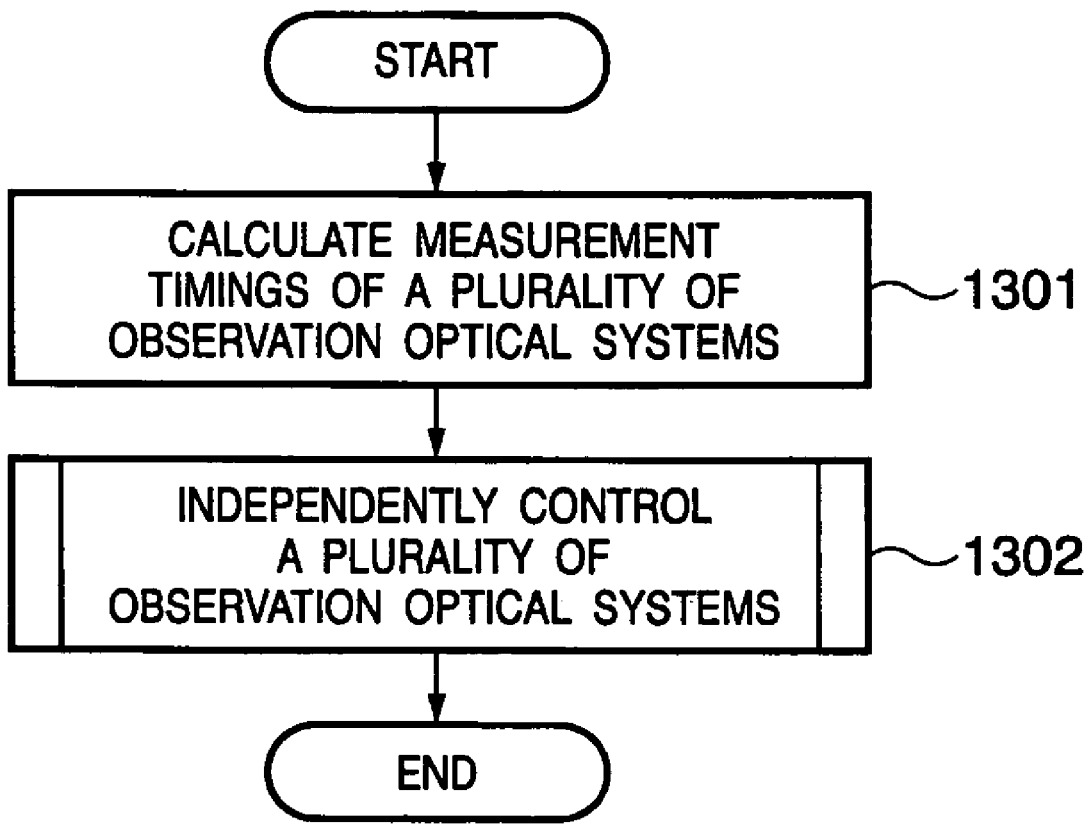
FIG. 13 is a flowchart showing the flow of a position measurement method according to the preferred embodiment of the present invention.

The flow of a position measurement method according to the preferred embodiment of the present invention will be explained below with reference to FIG. 13. In the position measurement method according to this embodiment, the wafer stage position reference mark 11 formed on the wafer 6 is sensed through the TTL observation optical system 12 and off-axis observation optical system 14. Position information of the wafer stage position reference mark 11 is measured on the basis of the image sensing result.

In step 1301, the measurement timing arithmetic processor 17 calculates the measurement timings of the TTL observation optical system 12 and off-axis observation optical system 14. More specifically, the measurement timing arithmetic processor 17 calculates the measurement timings of the TTL observation optical system 12 and off-axis observation optical system 14 on the basis of the amount of a variation in position information of the wafer stage position reference mark 11.

Figure 8:
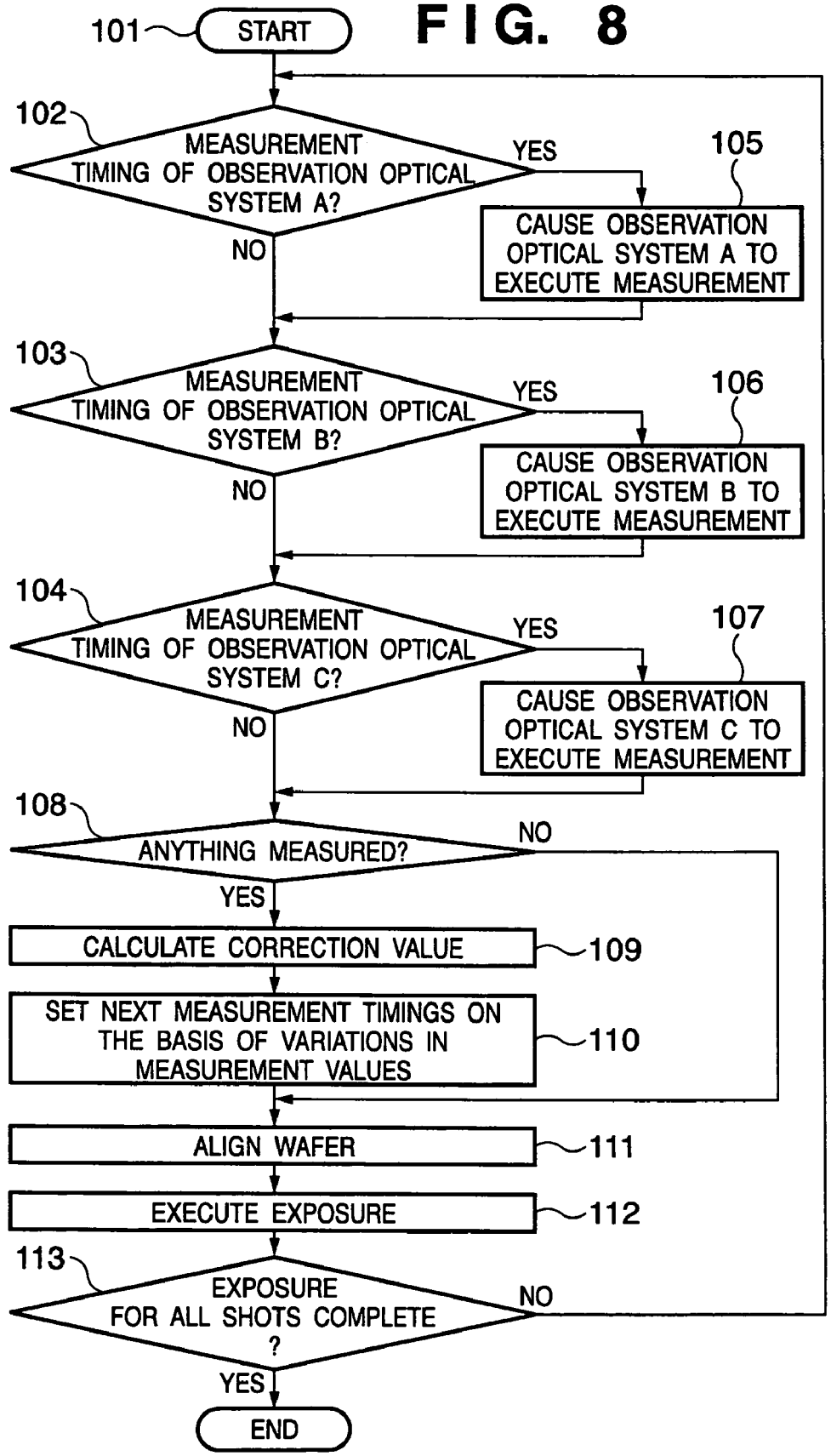
FIG. 8 is a flowchart showing the flow when a measurement timing setting method is applied to an exposure apparatus.
Figure 9:
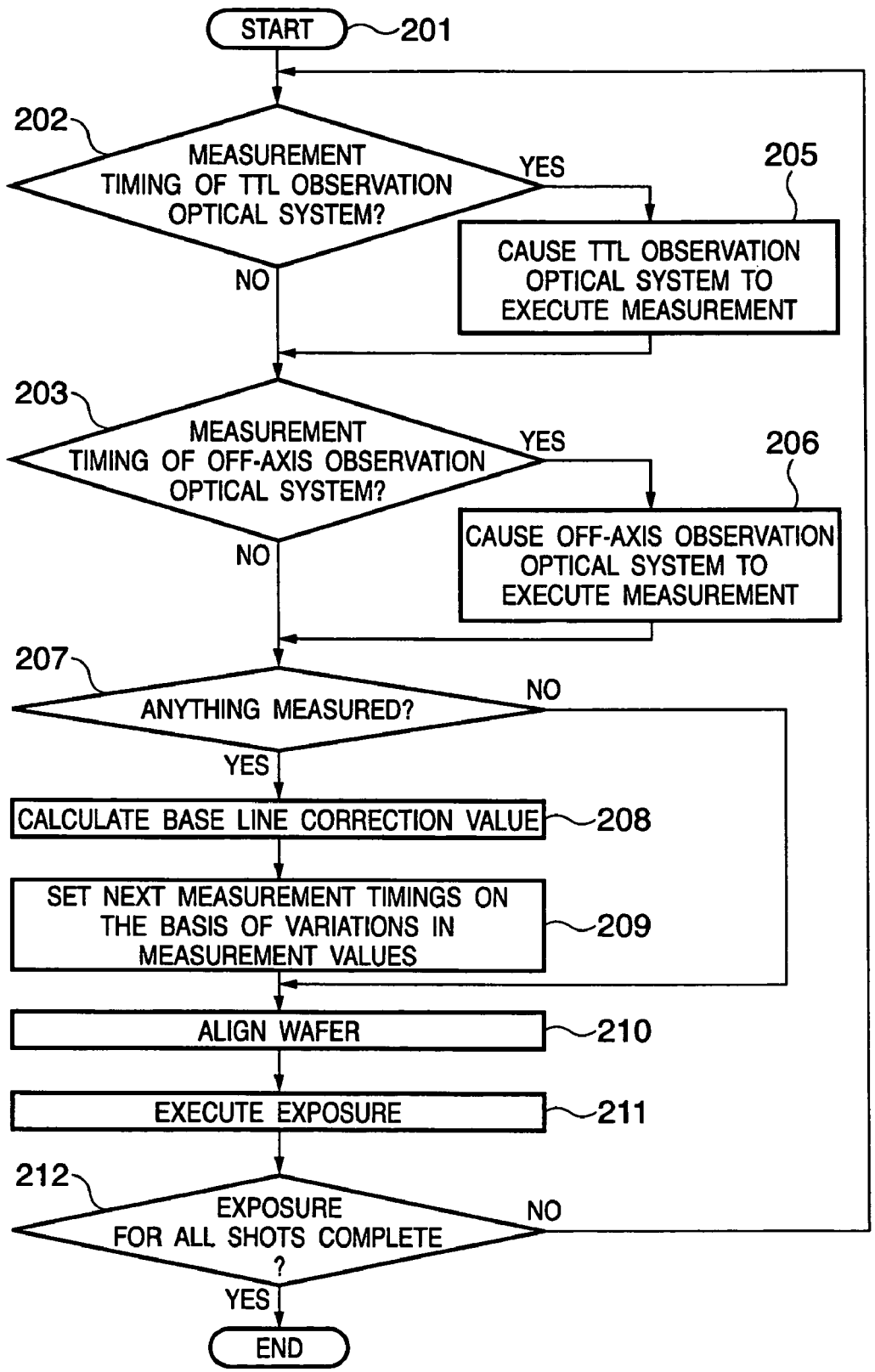
FIG. 9 is a flowchart showing the flow when the measurement timing setting method is applied to a base line measurement.
Figure 11:
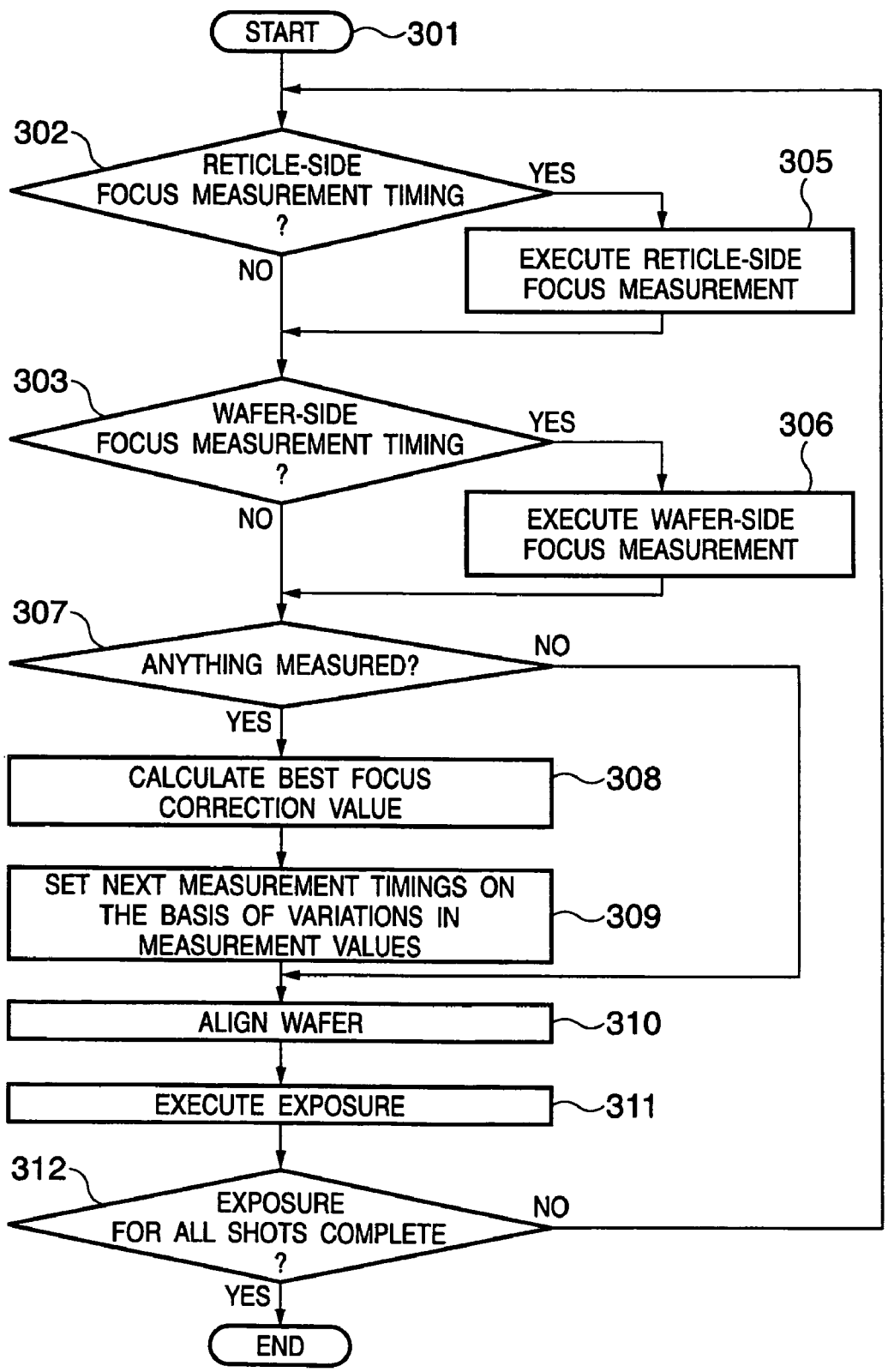
FIG. 11 is a flowchart showing the flow when the measurement timing setting method is applied to best focus measurement.

In step 1302, the controller 16 independently controls the TTL observation optical system 12 and off-axis observation optical system 14 at the measurement timings calculated in step 1301. The detailed flows of control operations in step 1302 are illustrated in FIGS. 8, 9, and 11, as will be described later. However, the control operations are not limited to these methods and can be appropriately changed.

A measurement timing determination method when various exposure conditions, such as an exposure load variation, air pressure variation, and elapsed time vary in the observation optical systems will be exemplified. A case wherein the exposure load on the exposure apparatus increases and decreases will be explained first with reference to FIG. 3.

Figure 3:
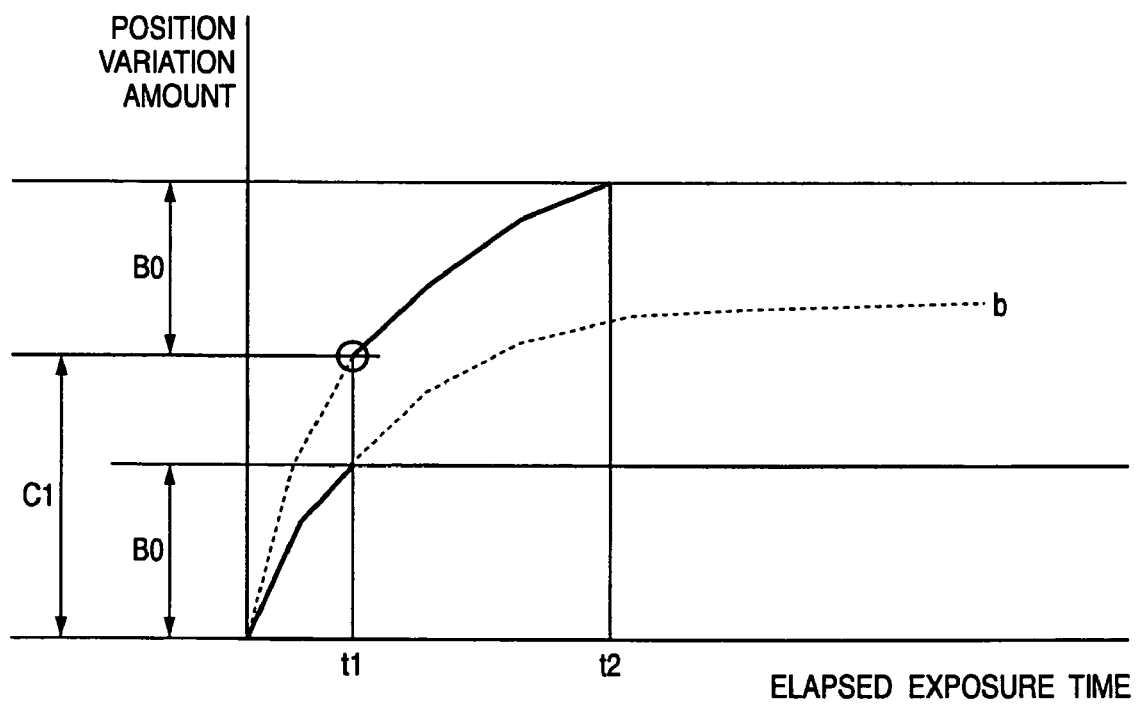
FIG. 3 is a graph showing a method of determining the measurement timing as a function of the elapsed exposure time (wafer count)

FIG. 3 is a graph representing a result obtained when the position variation amount b recorded in the measurement variation data file 31 and a value measured by each observation optical system as functions of the elapsed exposure time (wafer count) vary. An allowable measurement variation B0 is set in the allowable variation amount setting data file 32. An elapsed exposure time t1 beyond which the variation amount b exceeds the allowable measurement variation B0 is calculated and determined as a first measurement timing t1. A corresponding observation optical system performs measurement at the measurement timing t1. The allowable measurement variation B0 is compared with a variation amount C1 measured at this time to calculate an increase/decrease coefficient H ($H=a*C1/B0$ (a: adjustment coefficient)). The position variation amount b recorded in the measurement variation data file 31 is updated on the basis of the increase/decrease coefficient H. Similarly, an elapsed exposure time t2 beyond which the updated position variation amount b exceeds the allowable measurement variation B0 next is calculated and determined as a next measurement timing t2. In updating the measurement variation data file on the basis of the increase/decrease coefficient H, only the latest value may be used. However, the variation amount C1 measured at this time may be calculated by averaging or time-weighting several previous position variation amounts b. By repeating this method in the same manner, the next measurement timing is determined.

With this operation, if a measured variation amount C1 is larger than the allowable measurement variation B0, the next measurement timing can be set earlier than that in the schedule. If a measured variation amount C1 is less than the allowable measurement variation B0, the next measurement timing can be set later than that in the schedule.

Setting of the measurement timing as a function of the air pressure variation will be explained below.

Figure 4:
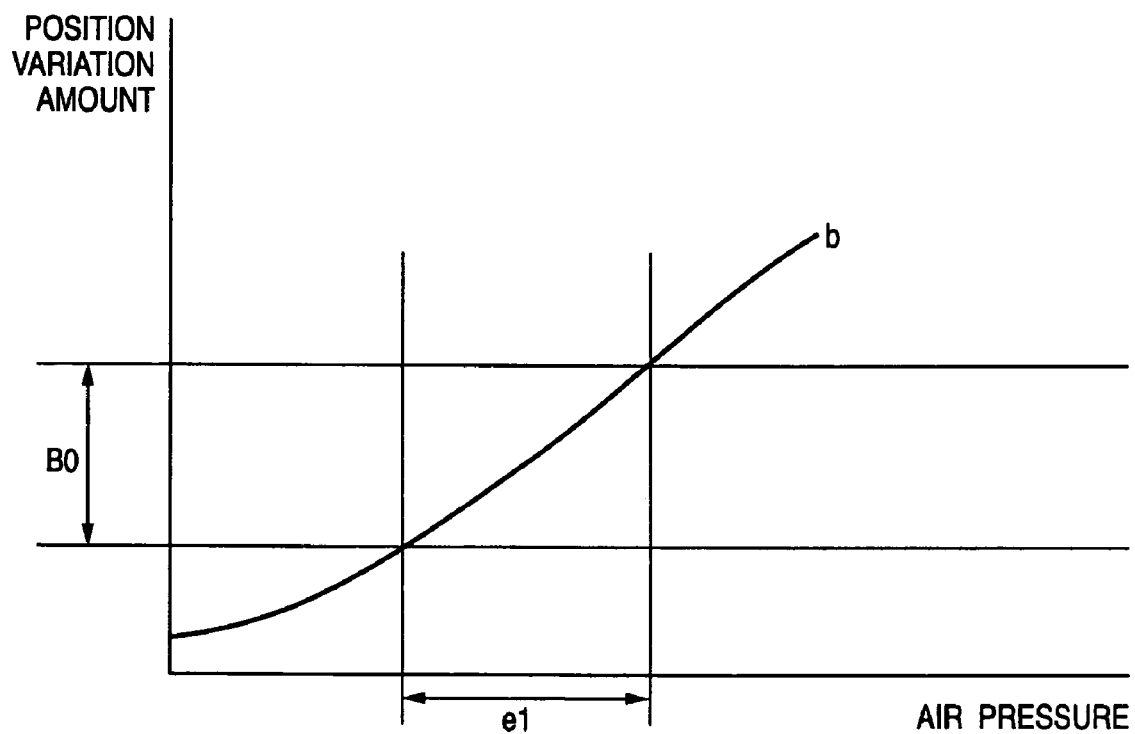
FIG. 4 is a graph showing an example in which a value measured by an observation optical system as a function of the air pressure variation varies.

FIG. 4 is a graph showing an example in which a value measured by each observation optical system as a function of the air pressure variation varies on the basis of the position variation amount b recorded in the measurement variation data file 31. On the basis of the result shown in FIG. 4, each observation optical system determines an allowable air pressure variation e1 beyond which the allowable measurement variation B0 has been exceeded. The observation optical system sets the allowable air pressure variation e1 in the allowable variation amount setting data file 32.

Figure 5:
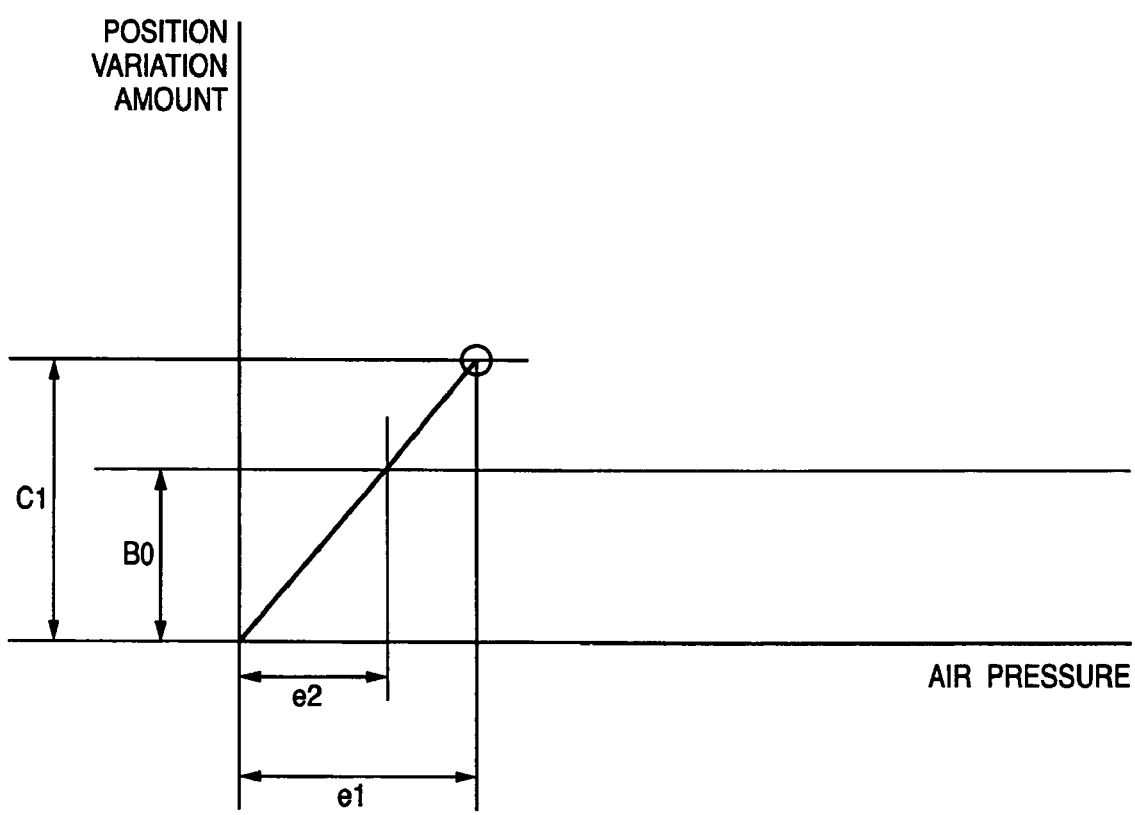
FIG. 5 is a graph showing a method of determining the next allowable air pressure variation on the basis of the variation amount measured when the allowable air pressure variation has been exceeded.

FIG. 5 is a graph showing an example in which a next allowable air pressure variation e2 is determined on the basis of a variation amount C1 measured when the allowable air pressure variation e1 has been exceeded. If a variation, which exceeds the allowable air pressure variation e1 set as described above, is detected, a corresponding observation optical system performs measurement. The variation amount C1 measured at this time is compared with the allowable measurement variation B0 to calculate an air pressure variation beyond which the allowable measurement variation B0 has been exceeded, thereby determining the next allowable air pressure variation e2. At the next time, a measurement is done when the changed allowable air pressure variation range e2 has been exceeded.

Also, in this case, in updating the measurement variation data file on the basis of a measured variation amount C1, only the latest value may be used. However, the variation amount C1 measured at this time may be calculated by averaging or time-weighting several previous position variation amounts b. By repeating this method in the same manner, the next measurement timing is determined.

Setting of the measurement timing as a function of the elapsed time will be explained below.

Figure 6:
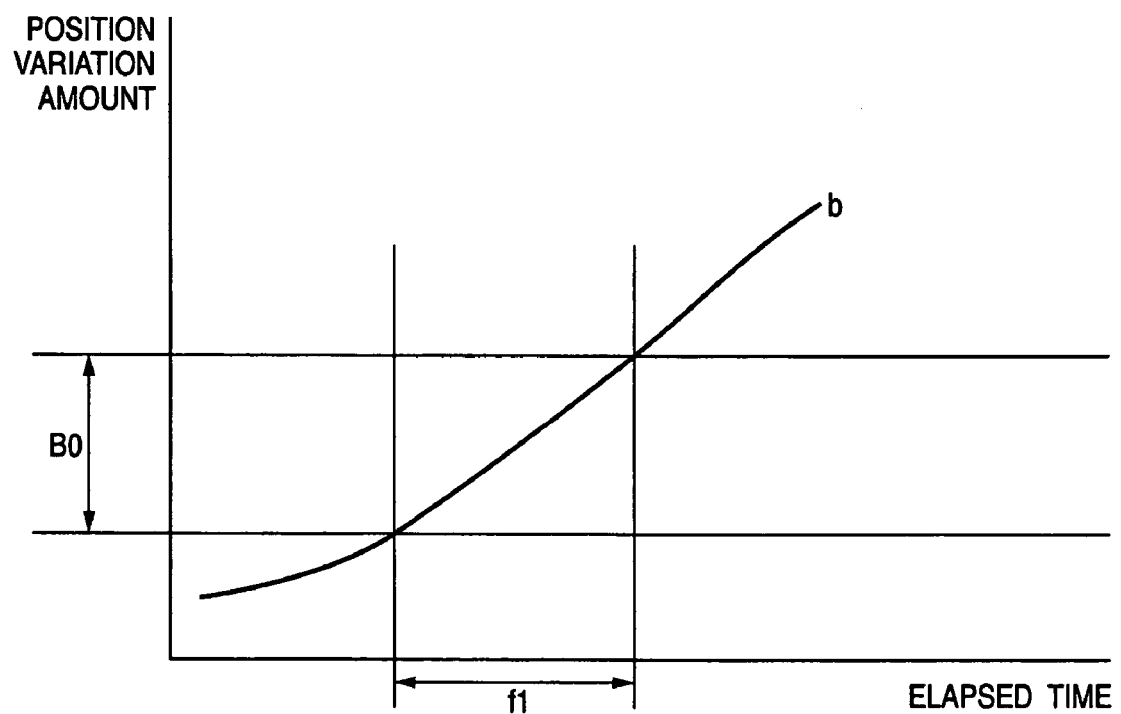
FIG. 6 is a graph showing an example in which a value measured by an observation optical system as a function of the elapsed time varies.

FIG. 6 is a graph showing an example in which a value measured by each observation optical system as a function of the elapsed time varies on the basis of the position variation amount b recorded in the measurement variation data file 31. On the basis of the result shown in FIG. 6, each observation optical system determines an allowable elapsed time f1 beyond which the allowable measurement variation B0 has been exceeded. The observation optical system sets the allowable elapsed time f1 in the allowable variation amount setting data file 32. If the set allowable elapsed time f1 has been exceeded, a corresponding observation optical system performs measurement.

Figure 7:
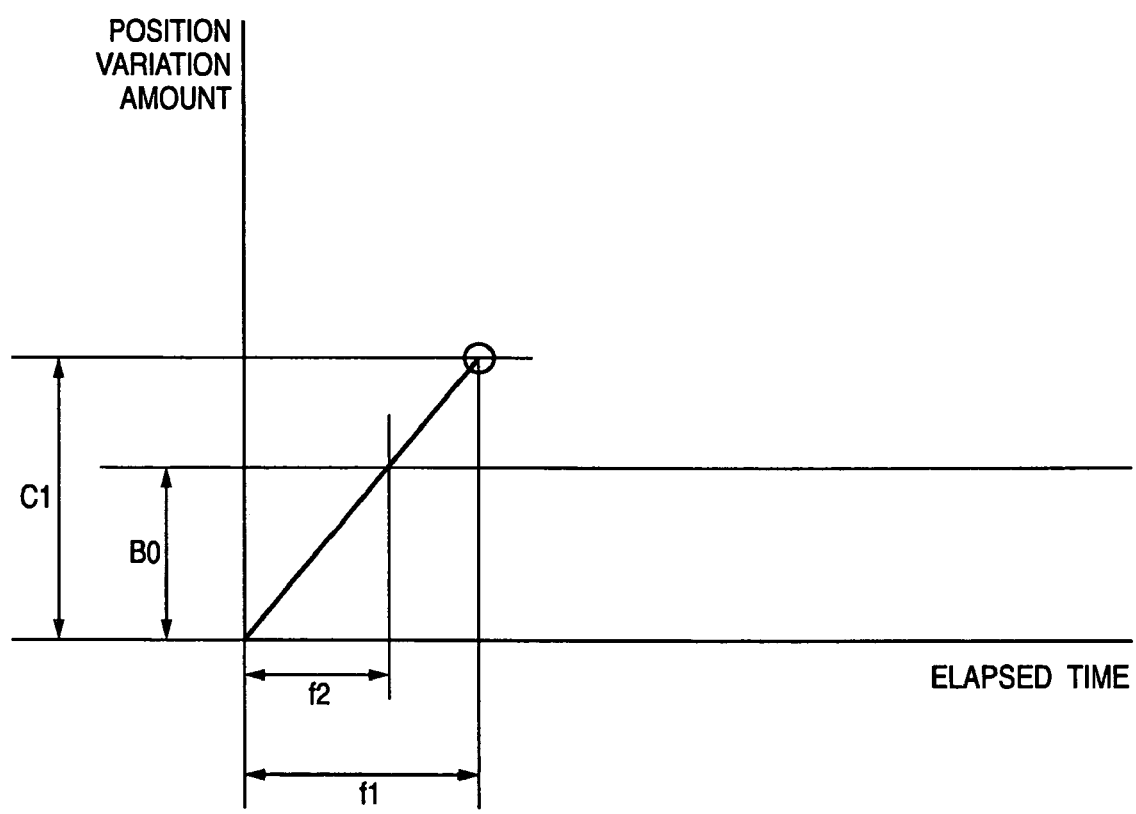
FIG. 7 is a graph showing a method of determining the next allowable elapsed time on the basis of the variation amount measured when the allowable elapsed time has been exceeded.

FIG. 7 is a graph showing an example in which a next allowable elapsed time f2 is determined on the basis of a variation amount C1 measured when the allowable elapsed time f1 has been exceeded. If a variation which exceeds the allowable elapsed time f1 set as described above is detected, a corresponding observation optical system performs measurement. The variation amount C1 measured at this time is compared with the allowable measurement variation B0 to calculate a time beyond which the allowable measurement variation B0 has been exceeded, thereby determining the next allowable elapsed time f2. At the next time, measurement is done when the changed allowable elapsed time f2 has been exceeded.

The measurement timings of the observation optical systems are determined in the above manner.

A case wherein a measurement timing setting method is applied to an exposure apparatus will be exemplified below with reference to FIG. 8. FIG. 8 is a flowchart showing details of control in step 1302 of FIG. 13. An item to be corrected is preset in the job in the exposure process procedure. At the beginning of activation of the exposure apparatus, no values measured by the observation optical systems exist. Hence, the observation optical systems perform measurements at a measurement timing set in the job, as in the prior art.

In step 101, an exposure process is started.

The controller 16 determines in step 102 whether the measurement timing of an observation optical system A is detected. If the measurement timing of the observation optical system A is detected ("YES" in step 102), the flow advances to step 105. If no measurement timing of the observation optical system A is detected ("NO" in step 102), the flow advances to step 103.

The controller 16 determines in step 103 whether the measurement timing of an observation optical system B is detected. If the measurement timing of the observation optical system B is detected ("YES" in step 103), the flow advances to step 106. If no measurement timing of the observation optical system B is detected ("NO" in step 103), the flow advances to step 104.

The controller 16 determines in step 104 whether the measurement timing of an observation optical system C is detected. If the measurement timing of the observation optical system C is detected ("YES" in step 104), the flow advances to step 107. If no measurement timing of the observation optical system C is detected ("NO" in step 104), the flow advances to step 108.

In step 105, the observation optical system A measures position information of the wafer stage position reference mark 11. In step 106, the observation optical system B measures position information of the wafer stage position reference mark 11. In step 107, the observation optical system C measures position information of the wafer stage position reference mark 11. In this manner, for each of the observation optical systems A to C, it is determined whether a measurement timing is detected. The targeted one of the observation optical systems A to C executes measurement.

The controller 16 determines in step 108 whether measurement is performed in any one of steps 105 to 107. If measurement is performed in any one of steps 105 to 107 ("YES" in step 108), the flow advances to step 109. If measurement is performed in none of steps 105 to 107 ("NO" in step 108), the flow advances to step 111.

In step 109, the controller 16 combines the values measured by the observation optical systems to calculate the correction value of a correction item set in a job.

In step 110, the measurement timing arithmetic processor 17 updates the data in the allowable variation amount setting data file 32 as functions of the elapsed exposure time, air pressure variation, and elapsed time to calculate the next measurement timing on the basis of the latest data.

The controller 16 controls operation to execute wafer alignment in step 111 and exposure in step 112.

The controller 16 determines in step 113 whether exposure for all the shots on the wafer is complete. If exposure for all the shots is complete ("YES" in step 113), the wafer exposure process is ended. If an unexposed shot remains ("NO" in step 113), the flow returns to step 102.

A case wherein a measurement timing setting method is applied to base line measurement will be exemplified with reference to FIG. 9. FIG. 9 is a flowchart showing details of control in step 1302 of FIG. 13. In base line measurement, measurements are done using the TTL observation optical system 12 and off-axis observation optical system 14. In this exposure process procedure, base line correction is preset in the job as an item to be corrected.

In step 201, an exposure process is started.

The controller 16 determines in step 202 whether the measurement timing of the TTL observation optical system 12 is detected. If the measurement timing of the TTL observation optical system 12 is detected ("YES" in step 202), the flow advances to step 205. If no measurement timing of the TTL observation optical system 12 is detected ("NO" in step 202), the flow advances to step 203.

The controller 16 determines in step 203 whether the measurement timing of the off-axis observation optical system 14 is detected. If the measurement timing of the off-axis observation optical system 14 is detected ("YES" in step 203), the flow advances to step 206. If no measurement timing of the off-axis observation optical system 14 is detected ("NO" in step 203), the flow advances to step 207. If it is determined that the TTL observation optical system 12 needs to execute measurement, the TTL observation optical system 12 does the measurement. If it is determined that the off-axis observation optical system 14 needs to execute measurement, the off-axis observation optical system 14 does the measurement.

In step 205, the TTL observation optical system 12 measures position information of the wafer stage position reference mark 11. In step 206, the off-axis observation optical system 14 measures position information of the wafer stage position reference mark 11.

The controller 16 determines in step 207 whether measurement is performed in at least one of steps 205 and 206. If measurement is performed in at least one of steps 205 and 206 ("YES" in step 207), the flow advances to step 208. If measurement is not performed in either of steps 205 and 206 ("NO" in step 207), the flow advances to step 210.

If position information is measured by the TTL observation optical system 12 and off-axis observation optical system 14, the controller 16 combines in step 208 the values obtained by both the observation optical systems. If measurement is performed only by the off-axis observation optical system 14, the measured value is combined with the latest value held in the TTL observation optical system 12. If measurement is performed only by the TTL observation optical system 12, the measured value is combined with the latest value held in the off-axis observation optical system 14. In this manner, the controller 16 calculates the base line correction amount.

In step 209, the measurement timing arithmetic processor 17 updates the data in the allowable variation amount setting data file 32 as functions of the elapsed exposure time, air pressure variation, and elapsed time, to calculate the next measurement timing on the basis of the latest data.

The controller 16 controls operation to execute wafer alignment in step 210 and exposure in step 211.

The controller 16 determines in step 212 whether exposure for all the shots on the wafer is complete. If exposure for all the shots is complete ("YES" in step 212), the wafer exposure process is ended. If an unexposed shot remains ("NO" in step 212), the flow returns to step 202.

Even if a measurement timing calculated on the basis of the elapsed exposure time does not appear within a predetermined time, measurement is periodically performed at a measurement timing detected from the allowable elapsed time or allowable air pressure variation.

Even when the apparatus is inactive (downtime), after exposure completion, a measurement timing may be determined on the basis of the allowable elapsed time, allowable air pressure variation, or a decrease in exposure load, and measurement and correction may be automatically executed for a required observation optical system.

As described above, measurement timings are independently given for the respective observation optical systems to set measurement timings in consideration of variations unique to the observation optical systems, thereby allowing a required observation optical system to execute measurement. Correction is done on the basis of a result obtained by combining the measurement values.

The measurement variation data file is updated using the measured data and the next measurement timing is generated on the basis of the updated data. This makes it possible to shorten the times required for correction and measurement.

Figure 10:
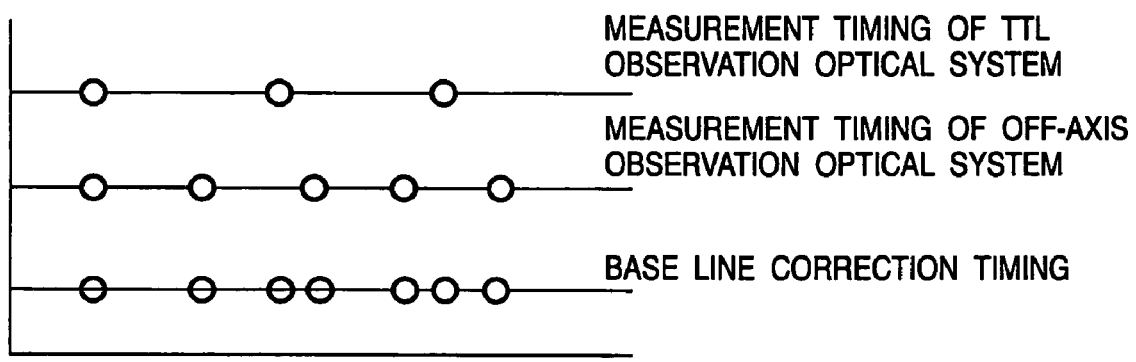
FIG. 10 is a view showing the base line measurement and correction timings.

FIG. 10 is a view illustrating the measurement timings of the off-axis observation optical system and TTL observation optical system when a position variation in the off-axis observation optical system 14 is large at the base line correction timing.

A case wherein the measurement timing setting operations are applied to best focus measurement will be exemplified below.

Best focus measurement is conventionally allowed by causing the TTL observation optical system 12 to perform focus measurements on the reticle-side mark 3 and wafer stage reference-side mark 11.

In such measurements, reticle-side and wafer-side focus measurements are executed at the same measurement timing, or measurement is done only on the wafer side to calculate the best focus position. The measurement timings are set in the job. Measurement is done at a measurement timing corresponding to every wafer exchange in exposure or a predetermined wafer count.

A measurement timing according to the preferred embodiment of the present invention will be exemplified below with reference to FIG. 11. FIG. 9 is a flowchart showing details of control in step 1302 of FIG. 13. In this exposure process procedure, best focus correction is preset in the job as an item to be corrected.

In step 301, an exposure process is started.

The controller 16 determines in step 302 whether the measurement timing at which the TTL observation optical system 12 is allowed to execute reticle side focus measurement is detected. If the measurement timing at which the TTL observation optical system 12 is allowed to execute reticle-side focus measurement is detected ("YES" in step 302), the flow advances to step 305. If no measurement timing at which the TTL observation optical system 12 is allowed to execute reticle-side focus measurement is detected ("NO" in step 302), the flow advances to step 303.

The controller 16 determines in step 303 whether the wafer-side focus measurement timing is detected. If the wafer-side focus measurement timing is detected ("YES" in step 303), the flow advances to step 306. If no wafer-side focus measurement timing is detected ("NO" in step 303), the flow advances to step 307.

Reticle-side focus measurement is executed in step 305 and wafer-side focus measurement is executed in step 306.

In this manner, for reticle side and wafer side focus measurements to be executed by the TTL observation optical system 12, it is determined whether measurement timings are detected. If reticle-side focus measurement is determined to be required, it is done. If wafer-side focus measurement is determined to be required, it is done.

The controller 16 determines in step 307 whether measurement is performed in at least one of steps 305 and 306. If measurement is performed in at least one of steps 305 and 306 ("YES" in step 307), the flow advances to step 308. If measurement is not performed in either of steps 305 and 306 ("NO" in step 307), the flow advances to step 310.

If the reticle-side and wafer-side focus measurements are executed, the controller 16 combines both the focus measurement values in step 308. If only the wafer-side focus measurement is executed, the measured value is combined with the held latest reticle-side focus measurement value to calculate the focus correction amount. If only the reticle-side focus measurement is executed, the measured value is combined with the held latest wafer-side focus measurement value to calculate the focus correction amount. As described above, the controller 16 independently gives reticle-side and wafer-side measurement timing data to the TTL observation optical system 12 to set measurement timings in consideration of variations unique to the respective observation targets, thereby allowing a required one to be measured. Correction is done using a result obtained by combining the measurement values.

The controller 16 controls operation to execute wafer alignment in step 310 and exposure in step 311.

The controller 16 determines in step 312 whether exposure for all the shots on the wafer is complete. If exposure for all the shots is complete ("YES" in step 312), the wafer exposure process is ended. If an unexposed shot remains ("NO" in step 312), the flow returns to step 302.

Figure 12:
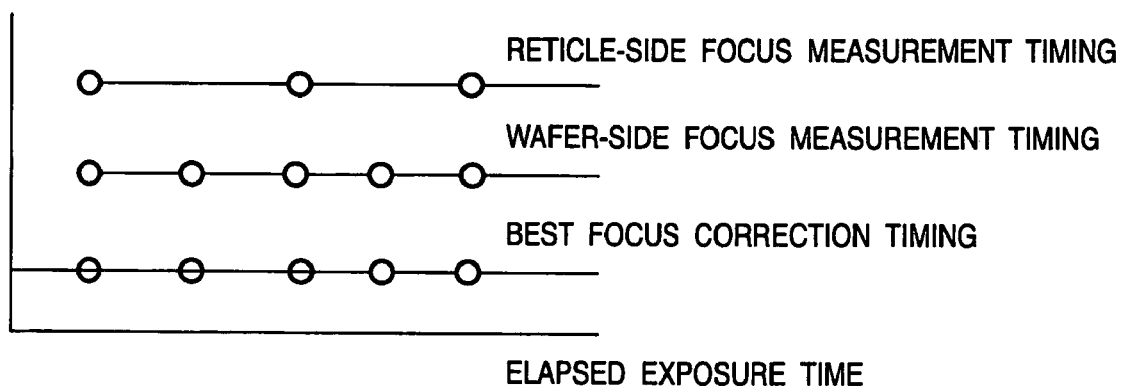
FIG. 12 is a view showing the best focus measurement and correction timings.

FIG. 12 is a view illustrating the reticle-side and wafer-side focus measurement timings when a variation in reticle side focus is small.

Assume that the respective observation optical systems execute measurements, not at the same timing, but at different times, to combine the measurement values, thus correcting the focus position. In the case of best focus correction, it is possible to exactly correct the focus position because a best focus result is calculated by wafer-side focus correction.

As for base line correction, the base line amount is calculated by measuring a variation in distance between the projection optical system and the off-axis optical system. Therefore, the observation optical systems are allowed to execute measurements at the same measurement timing. However, measurement values obtained by the observation optical systems are basically kept unchanged in the exposure apparatus after it is activated. Accordingly, a variation in state in each observation optical system is monitored after apparatus activation. For example, assume that the TTL observation optical system 12 suffers from position misalignment (position variation), the off-axis observation optical system 14 also suffers from position misalignment (position variation), and the base line amount is unchanged. In this case, the TTL observation optical system 12 and the off-axis observation optical system 14 record similar variations in the measurement variation data file obtained by pre-measurement by the corresponding exposure apparatus. As a result, both the observation optical systems can execute measurements at the same measurement timing, thus achieving exact correction.

Even when the apparatus is inactive after exposure completion, a measurement timing is determined on the basis of the allowable elapsed time or allowable air pressure variation, and measurement and correction are automatically done for a required observation optical system. Hence, correction and measurement need not necessarily be executed immediately after the job starts.

[Semiconductor Device Manufacturing Process]

Figure 14:
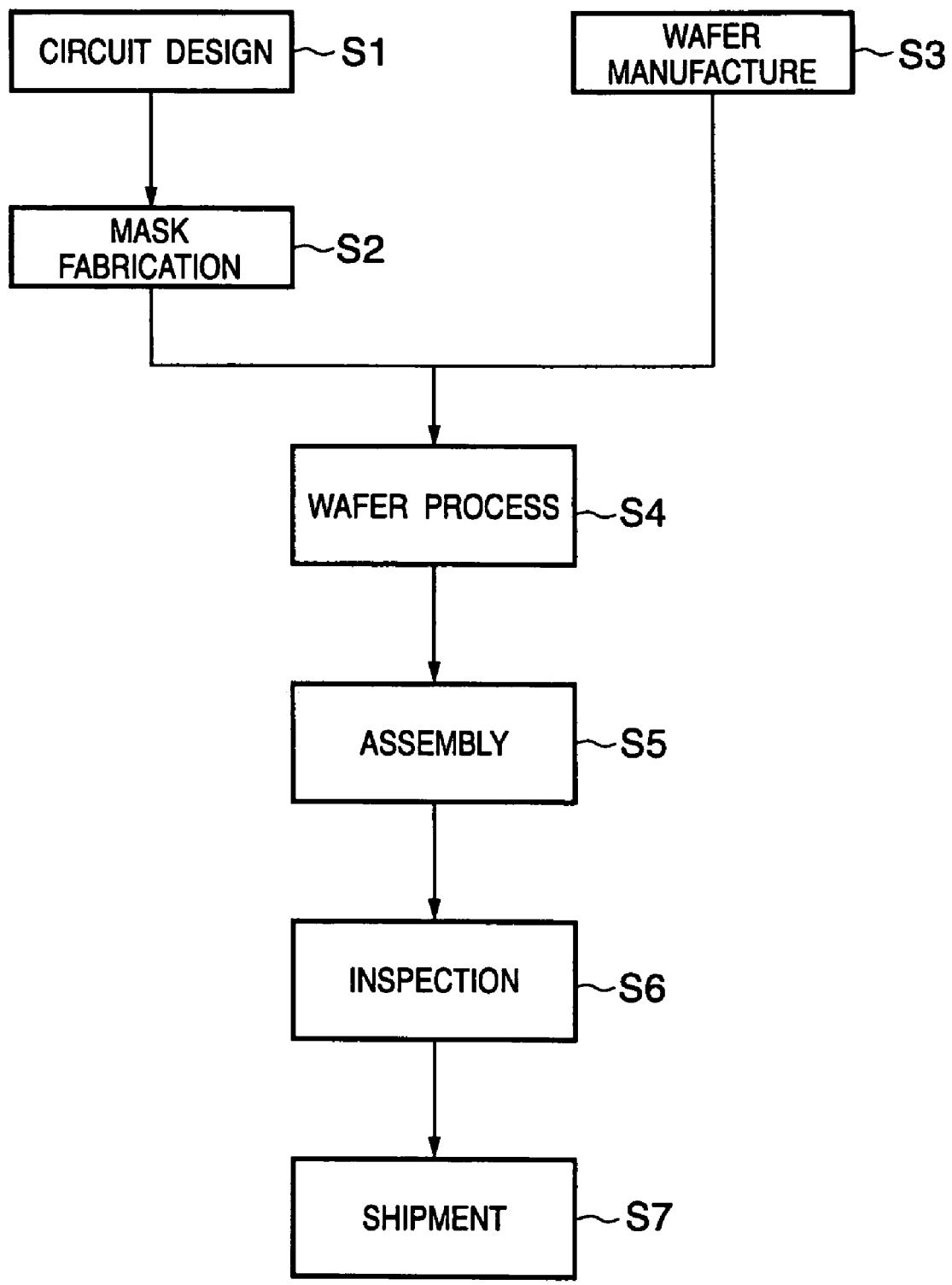
FIG. 14 is a flowchart showing the flow of the overall semiconductor device manufacturing process.
Figure 15:
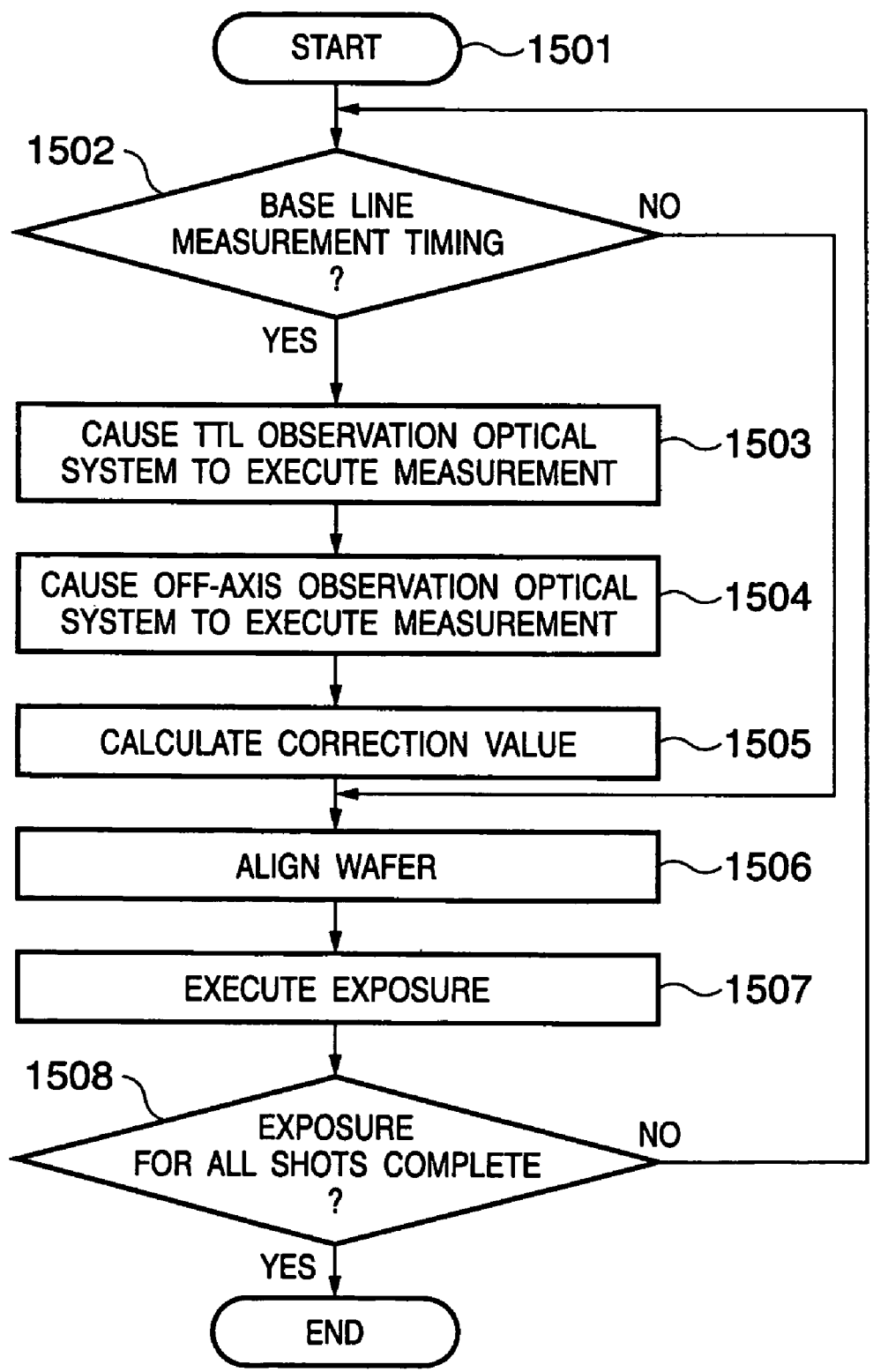
FIG. 15 is a flowchart showing the flow of the conventional base line measurement process.

A case wherein an exposure apparatus according to a preferred embodiment of the present invention is applied to a semiconductor device manufacturing process will be exemplified below. FIG. 14 is a flowchart showing the flow of the overall semiconductor device manufacturing process. In step S1 (circuit design), the circuit of a semiconductor device is designed. In step S2 (mask fabrication), a mask (also called an original or a reticle) is fabricated on the basis of the designed circuit pattern. In step S3 (wafer manufacture), a wafer (also called a substrate), is manufactured using a material such as silicon. In step S4 (wafer process), called a pre-process, a projection exposure apparatus according to the preferred embodiment of the present invention is caused to form an actual circuit on the wafer by lithography using the mask and wafer. In step S5 (assembly), called a post-process, a semiconductor chip is formed using the wafer manufactured in step S4. This step includes an assembly step (dicing and bonding) and a packaging step (chip encapsulation). In step S6 (inspection), the semiconductor device manufactured in step S5 undergoes inspections such as an operation confirmation test and a durability test. After these steps, the semiconductor device is completed and shipped in step S7.

The semiconductor device process in step S4 includes the following steps an oxidation step of oxidizing the wafer surface, a CVD step of forming an insulating film on the wafer surface, an electrode formation step of forming an electrode on the wafer by vapor deposition, an ion implantation step of implanting ions in the wafer, a resist processing step of applying a photosensitive agent to the wafer, an exposure step of causing the above described exposure apparatus to expose the wafer, which has been subjected to the resist processing step, through the mask on which the circuit pattern is formed, a development step of developing the latent image pattern of the wafer exposed in the exposure step, an etching step of etching portions other than the resist image developed in the development step, and a resist removal step of removing any unnecessary resist remaining after etching. By repeating these steps, a multilayered structure of circuit patterns is formed on the wafer.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus for transferring a pattern formed on a mask onto a substrate, said apparatus comprising:
   a projection optical system configured to project an image of the pattern formed on the mask onto the substrate;
   a substrate stage which includes a reference mark, and is configured to hold the substrate and to move;
   a position measurement system configured to measure a position of the substrate stage;
   a through-the-lens scope configured to detect positional information of the reference mark through the projection optical system;
   an off-axis scope configured to detect positional information of the reference mark without using the projection optical system; and
   a controller configured to control a position of the substrate stage and an operation of the through-the-lens scope and the off-axis scope, and to execute measurement of a relative positional relationship between the through-the-lens scope and the off-axis scope based on the positional information detected by the through-the-lens scope and the positional information detected by the off-axis scope,
   wherein the controller executes a detection of the positional information by the through-the-lens scope and a detection of the positional information by the off-axis scope at respective frequencies different from each other, based on an air pressure variation or an elapsed exposure time.

2. An apparatus according to claim 1, wherein the controller determines a timing at which the detection of the positional information by the through-the-lens scope is to be executed in accordance with the detection of the positional information by the through-the-lens scope that has been executed, and determines a timing at which the detection of the positional information by the off-axis scope is to be executed in accordance with the detection of the positional information by the off-axis scope that has been executed.

3. A method of manufacturing a device, said method comprising steps of:
   exposing a substrate to light using an exposure apparatus as defined claim 1;
   developing the exposed substrate; and processing the developed substrate to manufacture the device.

4. An exposure method of transferring a pattern formed on a mask onto a substrate using an exposure apparatus that includes a projection optical system configured to project an image of the pattern formed on the mask onto the substrate, a substrate stage which includes a reference mark, and is configured to hold the substrate and to move, a position measurement system configured to measure a position of the substrate stage, a through-the-lens scope configured to detect positional information of the reference mark through the projection optical system, and an off-axis scope configured to detect positional information of the reference mark without using the projection optical system, said method comprising steps of:

controlling a position of the substrate stage and an operation of the through-the-lens scope and the off-axis scope, and executing measurement of a relative positional relationship between the through-the-lens scope and the off-axis scope based on the positional information detected by the through-the-lens scope and the positional information detected by the off-axis scope; and executing detection of the positional information by the through-the-lens scope and detection of the positional information by the off-axis scope at respective frequencies different from each other, based on an air pressure variation or an elapsed exposure time.

5. A method according to claim 4, wherein, in the controlling step, a timing at which the detection of the positional information by the through-the-lens scope is to be executed is determined in accordance with the detection of the positional information by the through-the-lens scope that has been executed, and a timing at which the detection of the positional information by the off-axis scope is to be executed is determined in accordance with the detection of the positional information by the off-axis scope that has been executed.

* * * * *